(12) United States Patent
Yu et al.

(10) Patent No.: US 9,368,387 B2
(45) Date of Patent: Jun. 14, 2016

(54) METHOD OF FORMING SHALLOW TRENCH ISOLATION STRUCTURE

(71) Applicant: TAIWAN SEMICONDUCTOR MANUFACTURING COMPANY, LTD., Hsinchu (TW)

(72) Inventors: Tai-Yung Yu, Rende Township (TW); Hui Mei Jao, Tainan (TW); Jin-Lin Liang, Alian Township (TW); Chien-Hua Li, Tainan (TW); Cheng-Long Tao, Hsindian City (TW); Shian Wei Mao, Taipei (TW); Chien-Chang Fang, Fongshan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/858,094

(22) Filed: Sep. 18, 2015

(65) Prior Publication Data

US 2016/0005669 A1 Jan. 7, 2016

Related U.S. Application Data

(62) Division of application No. 12/838,901, filed on Jul. 19, 2010, now abandoned.

(60) Provisional application No. 61/226,971, filed on Jul. 20, 2009.

(51) Int. Cl.
*H01L 21/762* (2006.01)
*H01L 21/66* (2006.01)
(Continued)

(52) U.S. Cl.
CPC .... *H01L 21/76224* (2013.01); *H01L 21/02112* (2013.01); *H01L 21/304* (2013.01); *H01L 21/30604* (2013.01); *H01L 21/762* (2013.01);
(Continued)

(58) Field of Classification Search
CPC .. H01L 22/12; H01L 21/762; H01L 21/76224
See application file for complete search history.

(56) References Cited

U.S. PATENT DOCUMENTS 5,316,965 A 5/1994 Philipossian et al.
5,563,091 A 10/1996 Lee
(Continued)

OTHER PUBLICATIONS

Quirk et al., "Semiconductor Manufacturing Technology", 2001, Prentice Hall, pp. 464.

(Continued)

*Primary Examiner* — Joseph C Nicely
(74) *Attorney, Agent, or Firm* — Hauptman Ham, LLP

(57) ABSTRACT

A method of forming a shallow trench isolation (STI) structure in a substrate includes forming a pad oxide layer over the substrate. The method includes forming a nitride-containing layer over the pad oxide layer, wherein the nitride-containing layer has a first thickness. The method further includes forming the STI structure extending through the nitride-containing layer, into the substrate. The STI structure has a height above a top surface of the pad oxide layer. The method includes establishing a correlation between the first thickness, the height of the STI structure above the top surface of the pad oxide layer, and an offset between the first thickness and the height of the STI structure above the top surface of the pad oxide layer. The method includes calculating the height of the STI structure above the pad oxide layer based on the correlation, and selectively removing a determined thickness of the STI structure.

17 Claims, 3 Drawing Sheets

(51) Int. Cl.
  *H01L 21/02* (2006.01)
  *H01L 21/304* (2006.01)
  *H01L 21/306* (2006.01)

(52) U.S. Cl.
  CPC .......... *H01L 21/76229* (2013.01); *H01L 22/12* (2013.01); *H01L 22/20* (2013.01); *H01L 22/26* (2013.01)

(56) References Cited

U.S. PATENT DOCUMENTS

| | | | |
|---|---|---|---|
| 5,677,233 | A | 10/1997 | Abiko |
| 6,077,786 | A | 6/2000 | Chakravarti et al. |
| 6,194,285 | B1 * | 2/2001 | Lin .................. H01L 21/76237 257/E21.551 |
| 6,309,947 | B1 | 10/2001 | Bandyopadhyay et al. |
| 6,333,218 | B1 | 12/2001 | Ngo et al. |
| 6,613,646 | B1 | 9/2003 | Sahota et al. |
| 6,623,333 | B1 | 9/2003 | Patel et al. |
| 6,740,569 | B2 | 5/2004 | Shih et al. |
| 6,989,318 | B2 | 1/2006 | Doris et al. |
| 7,205,245 | B2 | 4/2007 | Fucsko et al. |
| 7,811,935 | B2 | 10/2010 | Sandhu |
| 7,919,335 | B2 | 4/2011 | Xiao et al. |
| 2001/0029093 | A1 | 10/2001 | Sekikawa et al. |
| 2002/0042154 | A1 | 4/2002 | Nakabayashi et al. |
| 2002/0197821 | A1 | 12/2002 | Liu |
| 2003/0153136 | A1 | 8/2003 | Matsumoto et al. |
| 2004/0097012 | A1 | 5/2004 | Weber et al. |
| 2006/0030106 | A1 | 2/2006 | Beintner |
| 2006/0148202 | A1 | 7/2006 | Jeong |
| 2006/0205150 | A1 | 9/2006 | Dong |
| 2006/0237769 | A1 | 10/2006 | Van Schaijk et al. |
| 2006/0278580 | A1 | 12/2006 | Striemer et al. |
| 2006/0289929 | A1 | 12/2006 | Andrews |
| 2006/0289947 | A1 | 12/2006 | Yamanaka |
| 2007/0032039 | A1 | 2/2007 | Chen et al. |
| 2007/0111467 | A1 | 5/2007 | Kim |
| 2007/0264827 | A1 | 11/2007 | Ding et al. |
| 2008/0003773 | A1 | 1/2008 | Kwak et al. |
| 2008/0035609 | A1 | 2/2008 | Kashkoush et al. |
| 2008/0078988 | A1 | 4/2008 | Forbes |
| 2008/0081384 | A1 | 4/2008 | Oh et al. |
| 2008/0087645 | A1 | 4/2008 | Izuta et al. |
| 2008/0087981 | A1 | 4/2008 | Matsuno |
| 2008/0099144 | A1 | 5/2008 | Change et al. |
| 2008/0179293 | A1 | 7/2008 | Wei et al. |
| 2008/0194075 | A1 | 8/2008 | Wu |
| 2008/0227268 | A1 | 9/2008 | Lee |
| 2008/0268599 | A1 | 10/2008 | Chambers et al. |
| 2008/0274595 | A1 | 11/2008 | Spencer et al. |
| 2008/0305611 | A1 | 12/2008 | Hirota |
| 2009/0087929 | A1 | 4/2009 | Yu et al. |
| 2010/0010659 | A1 | 1/2010 | Cohen et al. |
| 2010/0022069 | A1 | 1/2010 | Nakamori et al. |
| 2010/0049353 | A1 | 2/2010 | Takizawa et al. |
| 2010/0149625 | A1 | 6/2010 | Lu et al. |
| 2010/0267172 | A1 * | 10/2010 | Xiao .................. H01L 21/76224 438/16 |
| 2011/0260263 | A1 | 10/2011 | Carter et al. |

OTHER PUBLICATIONS

Microtech Knowledge Base, "Wet Etching of Silicon Dioxide", Apr. 26, 2006, http://www.microtechweb.com/kb/sio_etch.htm, pp. 1 and 2.

* cited by examiner

METHOD OF FORMING SHALLOW TRENCH ISOLATION STRUCTURE

PRIORITY CLAIM

The present application is a divisional of U.S. application Ser. No. 12/838,901, filed Jul. 19, 2010, which claims priority of U.S. Provisional Application No. 61/226,971, filed Jul. 20, 2009, which are incorporated herein by reference in their entireties.

TECHNICAL FIELD

The disclosure relates generally to integrated circuit manufacturing processes, and more particularly, to methods for controlling the dimension of a shallow trench isolation structure.

BACKGROUND

Shallow trench isolation (STI) has become a common and important isolation technology in an IC device. One of the purposes of STI is to prevent carriers, such as electrons or electron-holes, from drifting between two adjacent device elements through a semiconductor substrate to cause a leakage current.

A conventional STI process flow may include pad oxide layer and nitride-containing layer deposition on a substrate, active area masking, nitride-containing/oxide etching, silicon substrate trench etching, isolation oxide filling, chemical mechanical polishing, and nitride-containing layer and pad oxide layer removal.

In the conventional method, the predetermined target height of isolation oxide above the pad oxide layer cannot be well controlled. In some products, the electrical performance varies with the predetermined target height of isolation oxide. This lack of control also produces several problems, and one problem is divot formation (i.e. oxide recess) along an STI edge. Divot formation reduces device yield. The divot at the edge of the STI may be formed by having the pad oxide layer removed in a wet dip process.

BRIEF DESCRIPTION OF THE DRAWINGS

The disclosure will be described with reference to embodiments thereof as illustrated in the accompanying figures. It should be understood that the drawings are for illustrative purposes and therefore not drawn to scale.

DETAILED DESCRIPTION

The making and using of illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
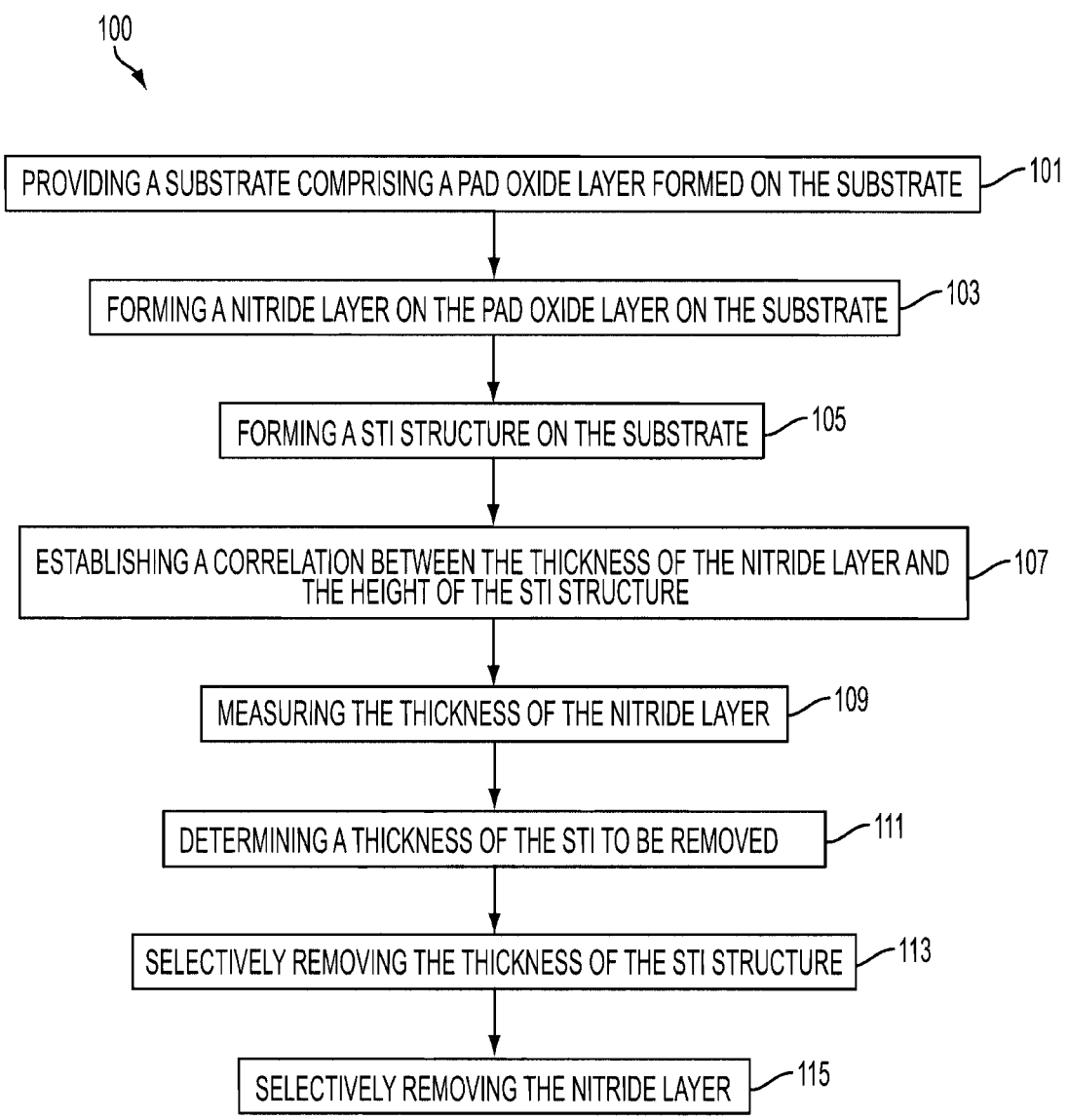
FIG. 1 is a flowchart of a method for fabricating a shallow trench isolation structure, in accordance with an embodiment of the present invention.
Figure 2:
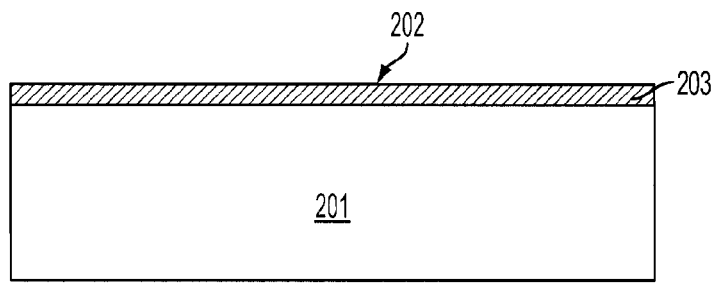
FIGS. 2 to 8 show cross-sectional views of a shallow trench isolation structure at various stages of manufacture according to FIG. 1.

FIG. 1 depicts a flowchart of a method 100 for fabricating a shallow trench isolation structure according to one embodiment of the invention. FIGS. 2 to 8 are cross-sectional views of a shallow trench isolation structure at various stages of manufacture according to FIG. 1. Referring to FIGS. 1 and 2, in process 101 step, a substrate 201 comprises a pad oxide layer 203 formed on the substrate 201. The term "substrate" herein, generally refers to a semiconductor substrate comprising silicon or compound semiconductor, such as GaAs, InP, Si/Ge, or SiC. The pad oxide layer 203 has a top surface 202 and may be grown by a conventional oxidation process over the substrate 201. Alternatively, the pad oxide layer 203 may be formed by a chemical vapor deposition (CVD) process or any suitable method. In one embodiment, the pad oxide layer 203 has a thickness from about 90 Angstroms (Å) to about 140 Å.

Figure 3:
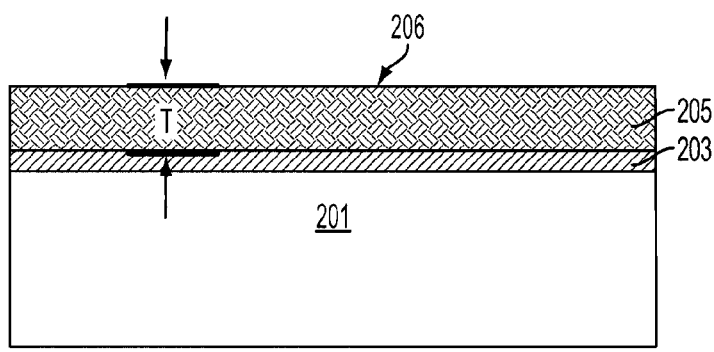

Referring to FIGS. 1 and 3, in process step 103, a nitride-containing layer 205 is formed over the pad oxide layer 203 on the substrate 201. Examples of nitride-containing layer 205 may include a nitride layer, a SiON layer, or any suitable material. In one embodiment, the nitride-containing layer 205 has a thickness T from about 800 Å to about 1600 Å. The nitride-containing layer 205 can function as a stop layer during a subsequent process, such as for example planarization. In one embodiment, the nitride-containing layer 205 has a top surface 206 and is formed by chemical vapor deposition (CVD). It is understood by those skilled in the art that nitride-containing layer 205 may be formed by other deposition process as well.

Referring to FIGS. 1 and 4-6, in process step 105, a shallow trench isolation (STI) structure 211 is formed in the substrate 201. The STI structure 211 extends through the nitride-containing layer 205, the pad oxide layer 203 and into the substrate 201.

Figure 4:
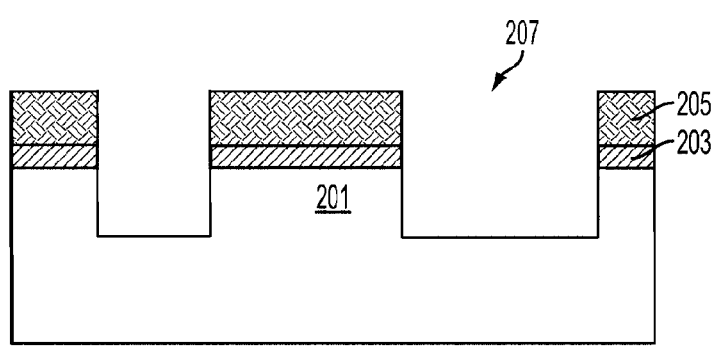

FIG. 4 illustrates a trench 207 that is etched and extends through the nitride-containing layer 205, the pad oxide layer 203 and into the substrate 201. The trench 207 may be formed by a plasma etching process or any suitable method.

Figure 5:
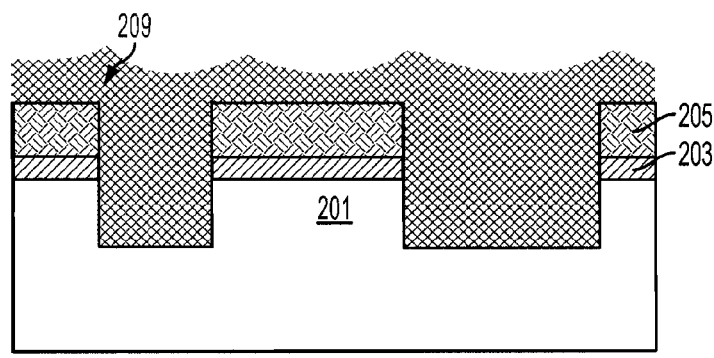

FIG. 5 illustrates an isolation oxide layer 209 is deposited to overfill the trench 207 and the top surface 206 of the nitride-containing layer 205. In one embodiment, the isolation oxide layer 209 is a material having a high gap fill characteristic, such as high-temperature undoped silicate glass (USG), a high density plasma (HDP) oxide, or a silicon oxide such as tetraethyl orthosilicate (TEOS).

Figure 6:
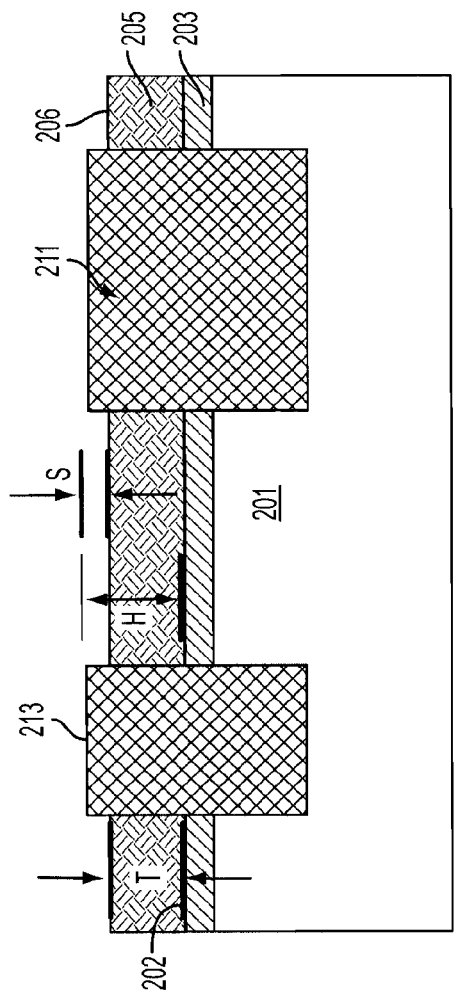
Figure 8:
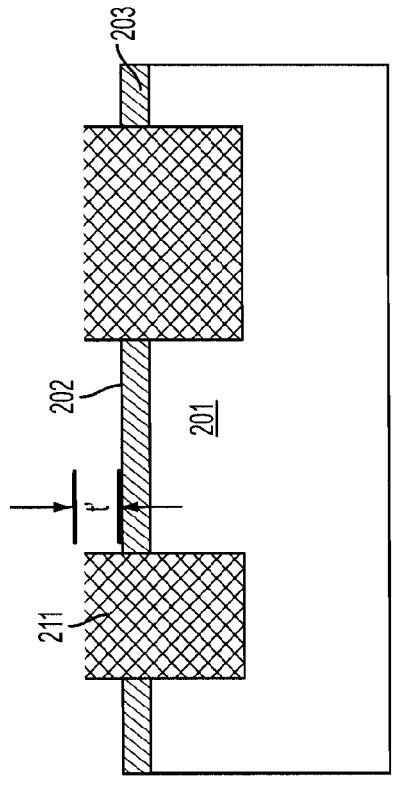

FIG. 6 illustrates the isolation oxide layer 209 being planarized to expose the top surface 206 of the nitride-containing layer 205. The planarization process removes the portion of the isolation oxide layer 209 that overfills the trench 207 to expose the top surface 206 of the nitride-containing layer 205. The planarization process may be performed using a chemical mechanical polishing (CMP) process, an etching process, and/or a combination thereof. After the steps shown in FIGS. 4 to 6, the STI structure 211 is formed and confined within the trench 207.

The STI structure 211 extends through the nitride-containing layer 205, the pad oxide layer 203 and into the substrate 201. The STI structure 211 has a top surface 213 and a height H. The height H is measured from the top surface 202 of the pad oxide layer 203 to the top surface 213 of the STI structure 211. During the formation of STI structure 211, a correlation between the thickness T of the nitride-containing layer 205 and the height H of STI structure 211 is established in process step 107. In one embodiment, the process 107 of establishing a correlation comprises polishing the STI structure 211 to the nitride-containing layer 205. The polishing makes the top surfaces 206, 213 of the nitride-containing layer 205 and the STI structure 211 substantially coplanar. Thus, the height H of STI structure 211 is substantially equal to the thickness T of the nitride-containing layer 205. In another embodiment, the process step 107 of establishing a correlation also comprises polishing the STI structure 211 to the nitride-containing layer 205. But if CMP process has different removing rates for the isolation oxide layer 209 and the nitride-containing layer 205, there is a step height difference S between the top surfaces 206, 213 of the nitride-containing layer 205 and the STI structure 211. Therefore, a measurement step may be needed to measure the step height difference S.

Referring back to FIG. 1, the fabricating method continues with process 109. The thickness T of the nitride-containing layer 205 is measured to calculate the height H of STI structure 211 according to the correlation in process step 107. The thickness T of the nitride-containing layer 205 is measured by a metrology tool. The metrology tool may include electrical and optical tools, such as film thickness measurement tools, or any suitable tool. In one embodiment, if the top surfaces 206, 213 of the nitride-containing layer 205 and STI structure 211, respectively are aligned, the height H of STI structure 211 is substantially equal to the thickness T of the nitride-containing layer 205. In another embodiment shown in FIG. 6, if the top surfaces 206, 213 of the nitride-containing layer 205 and STI structure 211, respectively are not aligned, the measured height H of STI structure 211 is the measured thickness T of the nitride-containing layer 205 plus the step height difference S measured between the nitride-containing layer 205 and the STI structure 211.

Figure 7:
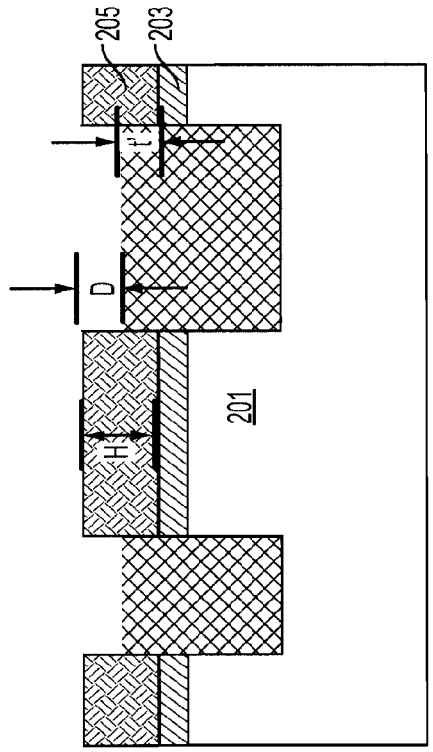

Referring again to FIG. 1, the fabricating method continues with process step 111. The process step 111 determines a thickness D on the top portion STI structure 211 to be selectively removed in a first solution. As shown in FIG. 7, the thickness D of the top portion STI structure 211 is a difference between the height H of STI structure 211 and a predetermined target height t' of the STI structure 211 above the pad oxide 203. An etching time for removing the thickness D could be calculated from the thickness D divided by a removing rate of STI structure 211 in the first solution.

Referring back to FIG. 1, the fabricating method continues with process step 113. The process step 113 selectively removes the thickness D of the top portion STI structure 211 by a first etching process. In one embodiment, the substrate 201 is dipped in a first solution for the etching time calculated in process step 111. By controlling the etching time, the demand of a precisely controlled predetermined target height t' for STI structure 211 for different products can be achieved. In one embodiment, the first wet solution comprises a HF solution, which is diluted at a rate of 50:1. In another embodiment, the first wet solution comprises any suitable solution. In some embodiments, the process step 113 comprises selectively etching the top portion STI structure 211 by a dry etching process.

Referring to FIG. 1, the fabricating method continues with process step 115. The process step 115 selectively removes the nitride-containing layer 205 without etching the STI structure 211 or the pad oxide 203 by a second etching process. In one embodiment, the process step 115 comprises dipping the substrate 201 in a second wet solution, which comprises a hot phosphoric acid solution. The second wet solution can be monitored and controlled to keep the silicon concentration in the second wet solution at a constant level, which is under an aggregate silicon concentration. The silicon concentration directly affects the etch rates of the nitride-containing and silicon oxide layers. For example, the oxide layer etch rate becomes dramatically lower as the silicon concentration in the second wet solution increases. The silicon concentration should be controlled under the aggregate silicon concentration to prevent silica precipitates from forming in the second wet solution. In one exemplary embodiment, the second wet solution may be maintained at a predetermined temperature within a range of about 70 to 160 to extend the bath life of the hot phosphoric bath. The silicon concentration may be maintained at a predetermined concentration within a range of about 57 to 110 parts per million (ppm). In another embodiment, the predetermined temperature is at about 150° C. It is understood by those skilled in the art that the process step 115 comprises removing the nitride-containing layer 205 by a dry etching process as well.

It is understood by those skilled in the art that the predetermined target height t' may vary between different products. In some cases, the electrical performance may vary with the predetermined target height t' of STI structure 211. The embodiments of the invention provide a method to form a shallow trench isolation structure having a precise predetermined target height control that achieves different demands for different products with robust electrical performance.

FIG. 1 depicts a flowchart of the method 100 for fabricating a shallow trench isolation structure for a single substrate. The method 100 can also be simultaneously performed on all of the substrates in a processing lot. In another embodiment, all of the process steps except for the measuring step 109 are simultaneously performed on all of the substrates in a processing lot, and the measuring step 109 is only performed on a subset of the substrates in the processing lot. For example, all of the substrates in the lot can be processed together during process steps 101, 103, 105 and 107. Since all of the substrates in the lot are processed together in those four steps, the correlation between the thickness of the nitride-containing and the height of the STI should be similar for each substrate in the lot, so the measurement taken on one substrate can be used to determine the thickness of STI to be removed for all of the substrates in the lot. Thus it should not be necessary to measure the nitride-containing layer thickness on every wafer in the lot if all of the substrates in the lot are processed together during the other process steps. However, the measuring step 109 may be performed on at least one substrate in the processing lot. After the thickness of STI to be removed is determined in process step 111, all of the substrates in the lot can be processed together in process steps 113 and 115.

One aspect of this description relates to a method of forming a shallow trench isolation structure in a substrate. The method includes forming a pad oxide layer over the substrate. The method further includes forming a nitride-containing layer over the pad oxide layer, wherein the nitride-containing layer has a first thickness. The method further includes forming the shallow trench isolation (STI) structure extending through the nitride-containing layer, the pad oxide layer and into the substrate, wherein the STI structure has a height above a top surface of the pad oxide layer. The method further includes establishing a correlation between the first thickness, the height of the STI structure above the top surface of the pad oxide layer, and an offset between the first thickness and the height of the STI structure above the top surface of the pad oxide layer. The method further includes measuring the first thickness of the nitride-containing layer. The method further includes calculating the height of the STI structure above the pad oxide layer based on the correlation. The method further includes determining a thickness of the STI structure to be removed according to a difference between the height of the STI above the pad oxide layer and a predetermined target height of the STI structure above the pad oxide. The method further includes selectively removing the determined thickness of the STI structure. The method further includes selectively removing the nitride-containing layer, after selectively removing the determined thickness of the STI structure, without substantially etching the STI structure or the pad oxide layer. The resulting STI structure of each of the first and second substrates has the predetermined target height above the pad oxide.

Another aspect of this description relates to a method of forming a shallow trench isolation structure in a substrate. The method includes forming a pad oxide layer over the substrate. The method further includes forming a nitride-containing layer on the pad oxide layer, wherein the nitride-containing layer has a thickness. The method further includes forming the shallow trench isolation (STI) structure extending through the nitride-containing layer, the pad oxide layer and into the substrate. The method further includes planarizing the STI structure, wherein planarizing the STI structure generates an offset between a top surface of the nitride-containing layer and a top surface of the STI structure. The method further includes measuring the thickness of the nitride-containing layer. The method further includes determining a height of the STI structure above the pad oxide, wherein the height of the STI structure above the pad oxide is determined based on a correlation between the thickness of the nitride-containing layer, the offset between the top surface of the nitride-containing layer and the top surface of the STI structure, and the height of the STI structure above the pad oxide. The method further includes calculating an etching time to selectively reduce a thickness of the STI structure in a hydrofluoric (HF) solution, wherein the thickness of the STI structure is a difference between the determined height of the STI structure and a predetermined target height of the STI structure above the pad oxide. The method further includes selectively reducing the thickness of the STI structure in the HF solution for the etching time. The method further includes thereafter selectively removing the nitride-containing layer with a phosphoric acid solution without removing the STI structure. The resulting STI structure has the predetermined target height above the pad oxide that remains on the substrate.

Still another aspect of this description relates to a method of forming a shallow trench isolation structure having a predetermined target height above a pad oxide layer on each substrate of a plurality of substrates. The method includes forming a nitride-containing layer on the pad oxide layer on each substrate of the plurality of substrates, wherein the nitride-containing layer has a thickness. The method further includes forming the shallow trench isolation (STI) structure in each substrate of the plurality of substrate to extend through the nitride-containing layer, the pad oxide layer and into a corresponding substrate. The method further includes measuring the thickness of the nitride-containing layer a single substrate of the plurality of substrates to determine a height of the STI structure above the pad oxide on the single substrate, wherein the height of the STI structure above the pad oxide is determined based on a correlation between the thickness of the nitride-containing layer, an offset between a top surface of the nitride-containing layer and the STI structure, and the height of the STI structure above the pad oxide. The method further includes calculating an etching time for each substrate of the plurality of substrates based on the measured thickness of the nitride-containing layer of the single substrate to selectively removing a thickness of the STI structure on each substrate of the plurality of substrates in a first wet solution, wherein the thickness of the STI structure is a difference between the determined height of the STI structure above the pad oxide layer and a predetermined target height of the STI structure above the pad oxide. The method further includes dipping each substrate of the plurality of substrates in the first wet solution to selectively etch the thickness of the STI structure for each substrate for the etching time. The method further includes selectively removing the nitride-containing layer, after selectively etching the STI structure, for each substrate of the plurality of substrates without etching a corresponding STI structure or a corresponding pad oxide. The resulting STI structure for each substrate of the plurality of substrate has the predetermined target height above the pad oxide.

Although exemplary embodiments of the present invention and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a shallow trench isolation structure in a substrate, the method comprising:
    forming a pad oxide layer over the substrate;
    forming a nitride-containing layer over the pad oxide layer, wherein the nitride-containing layer has a first thickness;
    forming the shallow trench isolation (STI) structure extending through the nitride-containing layer, the pad oxide layer and into the substrate, wherein the STI structure has a height above a top surface of the pad oxide layer;
    establishing a correlation between the first thickness, the height of the STI structure above the top surface of the pad oxide layer, and an offset between the first thickness and the height of the STI structure above the top surface of the pad oxide layer;
    measuring the first thickness of the nitride-containing layer;
    measuring the offset;
    calculating the height of the STI structure above the pad oxide layer based on the correlation;
    determining a thickness of the STI structure to be removed according to a difference between the height of the STI above the pad oxide layer and a predetermined target height of the STI structure above the pad oxide layer;
    selectively removing the determined thickness of the STI structure; and
    selectively removing the nitride-containing layer, after selectively removing the determined thickness of the STI structure, without substantially etching the STI structure or the pad oxide layer,
    whereby the resulting STI structure of each of the first and second substrates has the predetermined target height above the pad oxide layer,
    wherein the offset between the first thickness and the height of the STI structure above the top surface of the pad oxide layer is not equal to zero.

2. The method of claim 1, wherein said forming the STI structure comprises:
    etching a trench extending through the nitride-containing layer, the pad oxide layer, and into the substrate; and
    depositing an isolation oxide layer to overfill the trench.

3. The method of claim 2, further comprising planarizing the isolation oxide layer, wherein the planarizing generates the offset between the first thickness and the height of the STI structure above the top surface of the pad oxide layer.

4. The method of claim 1, wherein selectively removing the nitride-containing layer comprises dipping the substrate in a phosphoric acid solution.

5. The method of claim 4, further comprising:
controlling a silicon concentration in the phosphoric acid solution within a range of about 57 to 110 parts per million (ppm).

6. The method of claim 4, further comprising:
controlling a silicon concentration in the phosphoric acid solution to be under an aggregate silicon concentration, whereby the STI structure is not removed.

7. The method of claim 4, further comprising:
during said dipping, maintaining the phosphoric acid solution at a predetermined temperature.

8. A method of forming a shallow trench isolation structure in a substrate, the method comprising:
forming a pad oxide layer over the substrate;
forming a nitride-containing layer on the pad oxide layer, wherein the nitride-containing layer has a thickness;
forming the shallow trench isolation (STI) structure extending through the nitride-containing layer, the pad oxide layer and into the substrate;
planarizing the STI structure, wherein planarizing the STI structure generates an offset between a top surface of the nitride-containing layer and a top surface of the STI structure;
measuring the thickness of the nitride-containing layer;
measuring the offset;
determining a height of the STI structure above the pad oxide layer, wherein the height of the STI structure above the pad oxide layer is determined based on a correlation between the thickness of the nitride-containing layer, the offset between the top surface of the nitride-containing layer and the top surface of the STI structure, and the height of the STI structure above the pad oxide layer;
calculating an etching time to selectively reduce a thickness of the STI structure in a hydrofluoric (HF) solution, wherein the thickness of the STI structure is a difference between the determined height of the STI structure and a predetermined target height of the STI structure above the pad oxide layer;
selectively reducing the thickness of the STI structure in the HF solution for the etching time; and
thereafter selectively removing the nitride-containing layer with a phosphoric acid solution without removing the STI structure,
whereby the resulting STI structure has the predetermined target height above the pad oxide layer that remains on the substrate,
wherein the offset is not equal to zero.

9. The method of claim 8, wherein said forming the STI structure comprises:
etching a trench extending through the nitride-containing layer, the pad oxide layer, and into each substrate of the plurality of substrates;
depositing an isolation oxide layer to overfill the trench.

10. The method of claim 8, wherein said selectively removing the nitride-containing layer with the phosphoric acid solution comprises:
controlling a silicon concentration in the phosphoric acid solution to be under an aggregate silicon concentration, whereby the STI structure is not removed.

11. The method of claim 8, wherein said selectively removing the nitride-containing layer with the phosphoric acid solution comprises:
controlling a silicon concentration in the phosphoric acid solution within a range of about 57 to 110 parts per million (ppm).

12. The method of claim 8, wherein selectively removing the nitride-containing layer with the phosphoric acid solution comprising maintaining the phosphoric acid solution at a predetermined temperature.

13. A method of forming a shallow trench isolation structure having a predetermined target height above a pad oxide layer on each substrate of a plurality of substrates, the method comprising:
forming a nitride-containing layer on the pad oxide layer on each substrate of the plurality of substrates, wherein the nitride-containing layer has a thickness;
forming the shallow trench isolation (STI) structure in each substrate of the plurality of substrate to extend through the nitride-containing layer, the pad oxide layer and into a corresponding substrate;
measuring the thickness of the nitride-containing layer a single substrate of the plurality of substrates to determine a height of the STI structure above the pad oxide layer on the single substrate, wherein the height of the STI structure above the pad oxide layer is determined based on a correlation between the thickness of the nitride-containing layer, an offset between a top surface of the nitride-containing layer and the STI structure, and the height of the STI structure above the pad oxide layer;
calculating an etching time for each substrate of the plurality of substrates based on the measured thickness of the nitride-containing layer of the single substrate to selectively removing a thickness of the STI structure on each substrate of the plurality of substrates in a first wet solution, wherein the thickness of the STI structure is a difference between the determined height of the STI structure above the pad oxide layer and a predetermined target height of the STI structure above the pad oxide layer;
dipping each substrate of the plurality of substrates in the first wet solution to selectively etch the thickness of the STI structure for each substrate for the etching time; and
selectively removing the nitride-containing layer, after selectively etching the STI structure, for each substrate of the plurality of substrates without etching a corresponding STI structure or a corresponding pad oxide layer,
whereby the resulting STI structure for each substrate of the plurality of substrate has the predetermined target height above the pad oxide layer,
wherein the offset is measured, and the offset between the top surface of the nitride-containing layer and the STI structure is not equal to zero.

14. The method of claim 13, wherein said forming the STI structure comprises:
etching a trench extending through the nitride-containing layer, the pad oxide layer, and into each substrate of the plurality of substrates;
depositing an isolation oxide layer to overfill the trench; and
polishing the overfilled isolation oxide layer to expose the nitride-containing layer.

15. The method of claim 13, wherein the second wet solution comprises a phosphoric acid solution.

16. The method of claim 15, further comprising:
controlling a silicon concentration in the phosphoric acid solution to be under an aggregate silicon concentration, whereby the STI structure is not removed.

17. The method of claim 15, further comprising:
maintaining a silicon concentration in the phosphoric acid solution within a range of about 57 to 110 parts per million (ppm).

\* \* \* \* \*